United States Patent
Zhao

(10) Patent No.: US 6,995,615 B2
(45) Date of Patent: Feb. 7, 2006

(54) CURRENT-MODE PREAMPLIFIERS

(75) Inventor: Yang Zhao, Fremont, CA (US)

(73) Assignee: Elantec Semiconductor, Inc, Milpitas, CA (US)

( * ) Notice: Subject to any disclaimer, the term of this patent is extended or adjusted under 35 U.S.C. 154(b) by 0 days.

(21) Appl. No.: 10/850,504

(22) Filed: May 20, 2004

(65) Prior Publication Data

US 2005/0258905 A1    Nov. 24, 2005

(51) Int. Cl.
*H03F 3/08* (2006.01)

(52) U.S. Cl. .................................... 330/308; 330/288

(58) Field of Classification Search ............... 330/308, 330/288, 85; 327/315, 316
See application file for complete search history.

(56) References Cited

U.S. PATENT DOCUMENTS 4,994,758 A * 2/1991 Welty .................. 330/288
5,307,023 A * 4/1994 Schade, Jr. ............ 330/257

OTHER PUBLICATIONS

Gerben W. de Jong, et al., "A DC-to-250MHz Current Pre-Amplifier with Integrated Photo-Diodes in Standard CBiMOS, for Optical-Storage systems", 2002 IEEE International Solid-State Circuits Conference, pp:362-363, 474.

* cited by examiner

*Primary Examiner*—Henry Choe
(74) *Attorney, Agent, or Firm*—Fliesler Meyer LLP

(57) ABSTRACT

Current-mode preamplifiers are provided. In accordance with an embodiment, a current-mode preamplifier includes a transistor, that acts as an input stage for the preamplifier, and a pair of current mirrors. The transistor includes a gate connected to the input of the preamplifier, a source connected to a first voltage supply rail, and a drain. The first current mirror, which is connected to a second voltage supply rail, includes an input connected to the drain of the first transistor, and an output. The second current mirror, which is connected to the first voltage supply rail, includes an input connected to the output of the first current mirror, a first output connected to the input of the preamplifier, and a second output connected to the output of the preamplifier.

29 Claims, 5 Drawing Sheets

US 6,995,615 B2

CURRENT-MODE PREAMPLIFIERS

FIELD OF THE INVENTION

Embodiments of the present invention relate to the field of integrated circuits, and more specifically to preamplifiers.

BACKGROUND

Generally, optical data transmission and optical storage systems require the use of current-input preamplifiers to condition the electrical signals received in the form of current pulses from input photodiodes. A commonly used topology for the preamplifier is the Trans-Impedance Amplifier (TIA) that converts the input current to voltage for the subsequent signal processing.

A conventional TIA 100 shown in FIG. 1 includes an amplifier 104 (e.g., an operational amplifier) having an inverting input (−), a non-inverting input (+), and an output. In the configuration shown, the non-inverting input (+) receives a biasing voltage. The inverting input (−) receives a current signal produced by a photo-detector 102 that is operated in a current sensing photoconductive mode. The output of the amplifier 104 is fed back to the inverting input (−) through a feedback resistor $R_F$, thereby forming a voltage-current feedback network that senses the voltage at the output and returns a proportional current to the input. The −3 dB bandwidth is given by:

$$f_{-3\ dB} = (1/2\pi) \cdot A_{TIA}/(R_F \cdot C_D)$$

where $R_F$ is the feedback resistor, $C_D$ is the photodiode capacitance, and $A_{TIA}$ is the open-loop gain of the TIA.

With a TIA, such as the one shown in FIG. 1, there is a direct trade-off between the gain and the bandwidth, making it difficult to achieve both high-gain and wide bandwidth with a large photodiode capacitance. In addition, due to the finite bandwidth of the TIA, the input impedance $Z_{in}$, which is equal to $R_F/A_{TIA}$, varies with frequency, making it behave like an inductance rather than a resistance. The resulting L-C tank at the TIA input may lead to gain peaking at high frequencies. In summary, disadvantages of the TIA approach include: strong process-dependency of gain setting due to the use of a feedback resistor as a gain element; limited input dynamic range for any fixed-gain setting; direct trade-off between the gain and the bandwidth; inherent gain peaking issues due to the inductive input impedance; and the need for a complex phase compensation network for variable gain settings.

SUMMARY OF THE PRESENT INVENTION

Rather than using a conventional TIA topology for a preamplifier, embodiments of the present invention use an alternative current-mode approach.

In accordance with an embodiment of the present invention, a current-mode preamplifier includes a transistor, which acts as an input stage for the preamplifier, and a pair of current mirrors. The transistor includes a gate connected to the input of the preamplifier, a source connected to a first voltage supply rail (e.g., 3.3V), and a drain. The first current mirror, which is connected to a second voltage supply rail (e.g., 0V), includes an input connected to the drain of the first transistor (e.g., 3.3V), and an output. The second current mirror, which is connected to the first voltage supply rail, includes an input connected to the output of the first current mirror, a first output connected to the input of the preamplifier, and a second output connected to the output of the preamplifier. If it is desirable to have a preamplifier with multiple outputs, then one or more further outputs can be added to the second current mirror.

While not limited to such uses, embodiments of the present invention are very useful as preamplifiers for optoelectronic integrated circuit (OEIC) applications, such as optical storage device applications and optical data transmission applications.

Further embodiments and details, and the features, aspects, and advantages of the present invention will become more apparent from the detailed description set forth below, the drawings and the claims.

DETAILED DESCRIPTION

Figure 1:
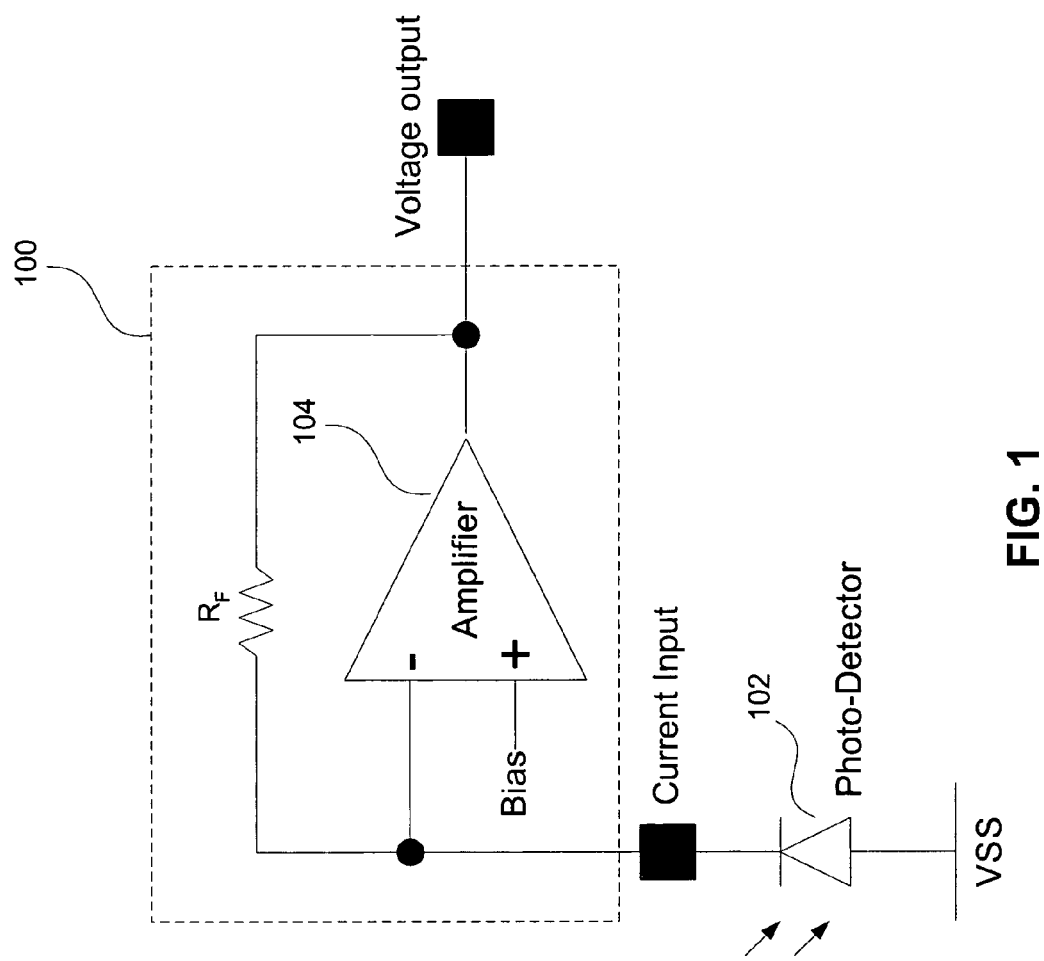
FIG. 1 is a high level block diagram useful for explaining a conventional TIA approach for a preamplifier.
Figure 2:
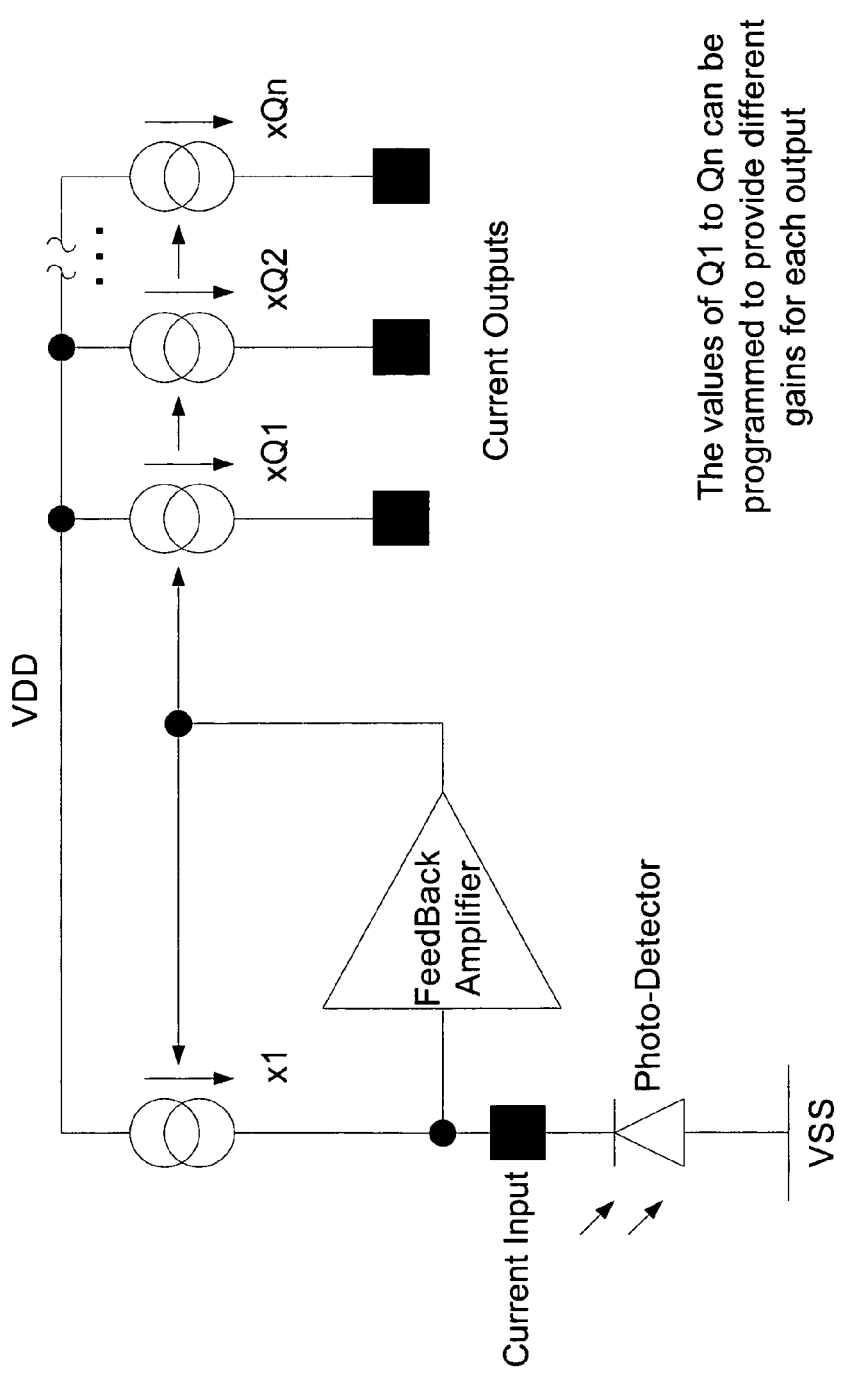
FIG. 2 is a high level block diagram useful for describing current-mode preamplifiers in general.

FIG. 2 is a high level diagram useful for describing a current-mode preamplifier. The preamplifier acts as a current amplifier where multiple independent decoupled outputs are possible. Each output can have a different gain setting and the current gain from the input to the various possible outputs is controlled by the ratios Q1, Q2 . . . Qn. The transfer function defined by Q1~Qn is stable and process independent because the preamplifier does not utilize an internal resistor to create an output voltage, as in conventional TIA approaches. The multiple current outputs simplify summation of various detector signals, as is often required for optical storage applications.

Figure 3A:
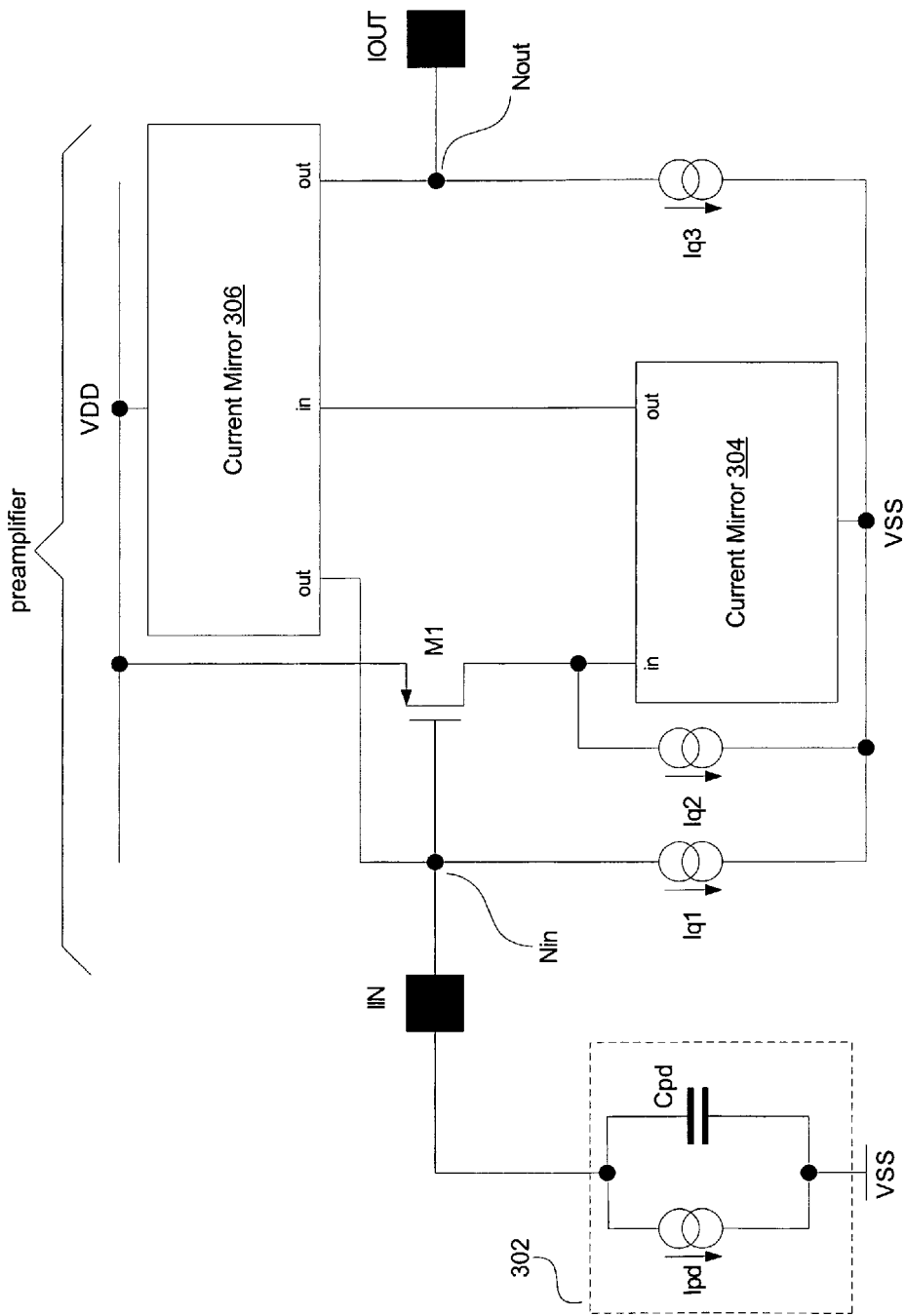
FIG. 3A is high level circuit diagram that implements a current-mode preamplifier in accordance with an embodiment of the present invention.
Figure 3B:
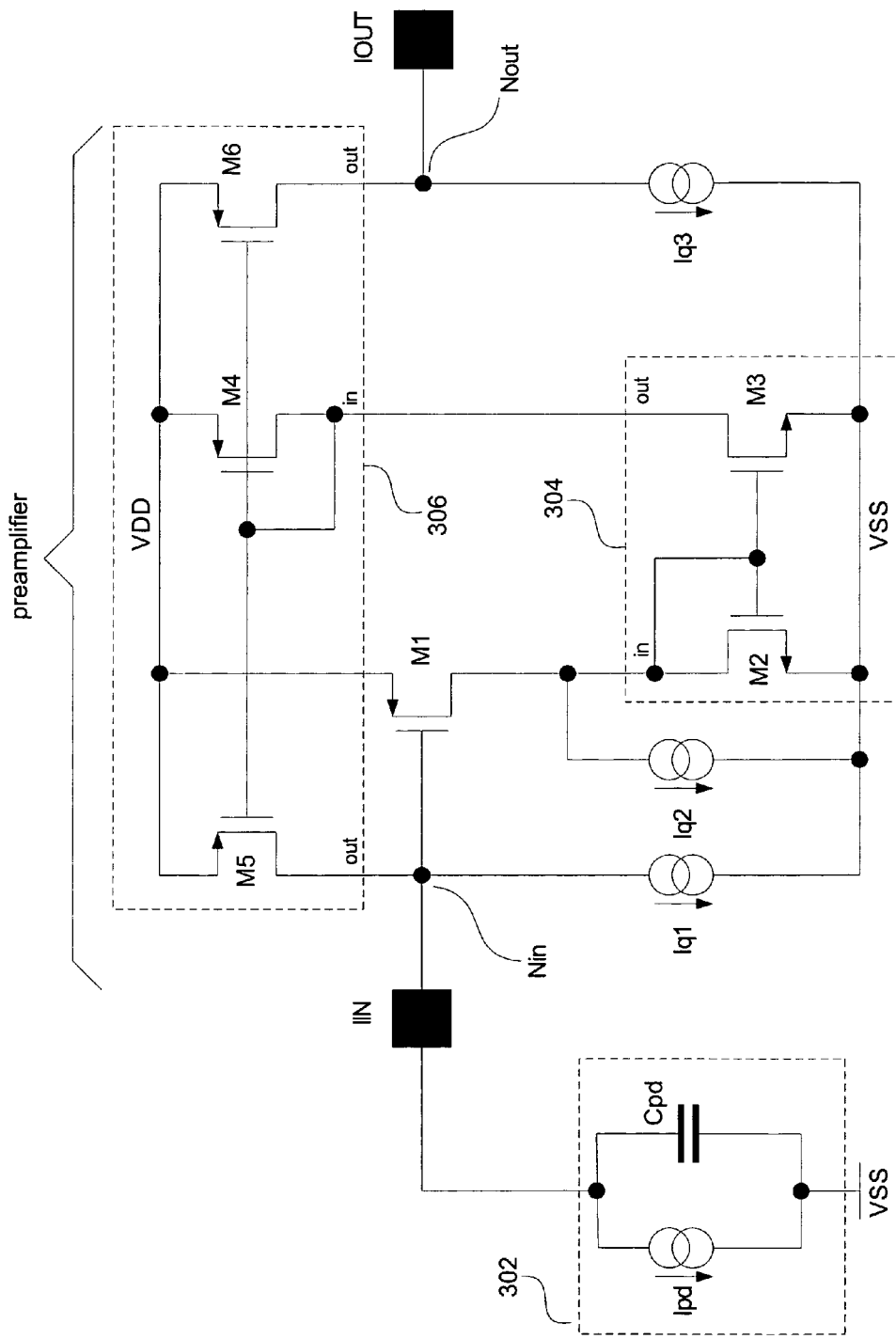
FIG. 3B is lower level circuit diagram that implements a current-mode preamplifier in accordance with an embodiment of the present invention.
Figure 3C:
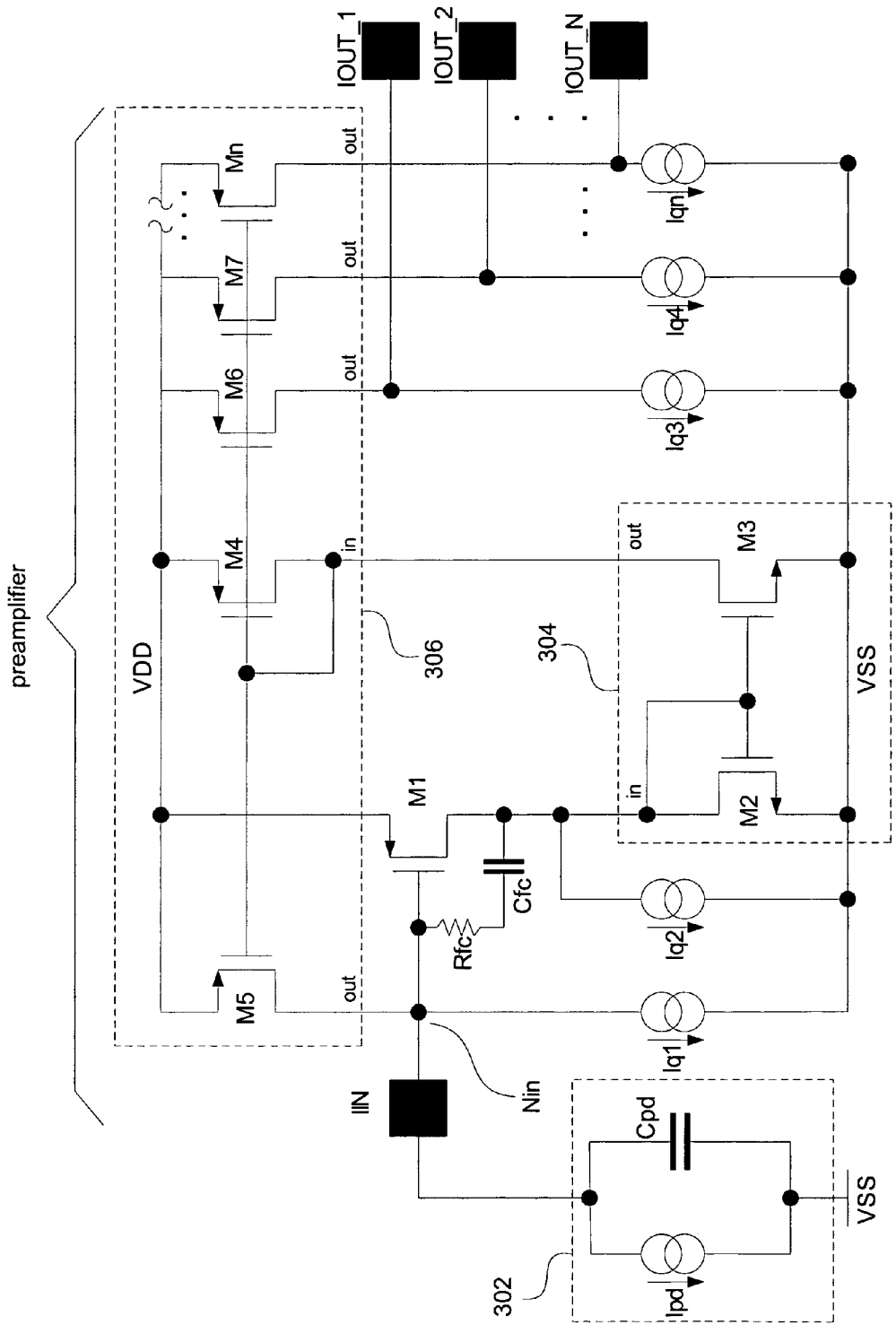
FIG. 3C is a circuit diagram similar to FIG. 3B, but with a frequency compensation circuit, as wells a multiple outputs, explicitly shown.

Current-mode preamplifiers according to embodiments of the present invention will now be described with references to FIGS. 3A–3C. In FIGS. 3A–3C, a photo-detector 302 is modeled as a current source Ipd in parallel with a capacitance Cpd. Referring first to FIG. 3A, a current preamplifier according to an embodiment of the present invention is shown as including a transistor M1 and a pair of current mirrors 304 and 306. The current mirror 304 includes an input and an output. The current mirror 306 includes an input and at least two outputs, one to provide a feedback current, and another to provide an output current. To provide additional outputs for the current-mode preamplifier, additional outputs are added to the current mirror 306.

The transistor M1, which acts as the input stage of the preamplifier, includes a gate connected to the input (Nin) of the preamplifier, a source connected to a voltage supply rail VDD (e.g., 3.3V), and a drain connected to an input to the current mirror 304.

In accordance with an embodiment of the present invention, a first biasing current source Iq1 is connected between the input (Nin) of the preamplifier and a voltage supply rail VSS (e.g., 0V). Stated another way, the biasing current Iq1 is connected between an output of the current mirror 306 and the voltage supply rail VSS. Iq1 provides a DC bias current for the current mirror 306. The value of Iq1 is preferably chosen as the best compromise between bandwidth, improved (increased) by increasing Iq, and shot noise contribution, improved (reduced) by decreasing Iq1. For example, the bias level at Iq1 can be about 10 µA.

In accordance with an embodiment of the present invention, a second biasing current source Iq2 is connected between the input of the current mirror 304 and the voltage supply rail VSS. Stated another way, the biasing current Iq2 is connected between the drain of transistor M1 and the voltage supply rail VSS. The independent DC bias current Iq2 is added to substantially boost the transconductance of transistor M1 whilst negligible extra shot noise added at the input node. The increase in the transconductance of transistor M1 improves (lowers) the input impedance. The presence of Iq2 increases the current through transistor M1 and allows the size of transistor M1 to be increased to a relatively large size, thereby reducing the effective input noise floor. For example, the bias level at Iq2 can be about 1 mA.

In accordance with an embodiment of the present invention, a third biasing current source Iq3 is connected between the output of the preamplifier and the voltage supply rail VSS. Stated another way, the biasing current Iq3 is connected between an output of the current mirror 306 and the voltage supply rail VSS. Iq3 also provides a DC bias current for the current mirror 306.

It is noted that some of the biasing current sources can be used while other are not used. For example, in the preamplifier of FIG. 3B, the biasing of transistor M1 is independent of the biasing of the transistors of the current mirror 306. In other words, the biasing current source Iq2 can be used, without using the biasing current sources Iq1 and Iq3. Additionally, it is noted that biasing current sources Iq1 and Iq3 can be used, without using the biasing current source Iq2. It is even possible, though not desirable, to use the biasing current source Iq1 without using biasing current source Iq3, or vise versa.

Referring now to FIG. 3B, in accordance with an embodiment of the present invention, the current mirror 304 includes a transistor M2 and a transistor M3, which are connected in a common source configuration and a common gate configuration. The gate and the drain of transistor M2 are connected together. The drain of transistor M2 forms the input of the current mirror 304, and the drain of transistor M3 forms the output of the current mirror 304. Transistors M2 and M3 are shown as being NMOS transistors, with their sources connected to the supply voltage rail VSS.

In accordance with an embodiment of the present invention, the current mirror 306 includes a transistor M4, a transistor M5 and a transistor M6, which are connected in a common source configuration and a common gate configuration. The gate and the drain of transistor M4 are connected together. The drain of transistor M4 forms the input of the current mirror 306. The drain of transistor M5 forms a first output of the current mirror 306. The drain of transistor M6 forms a second output of the current mirror 306. Transistors M4, M5 and M6 are shown as being PMOS transistors, with their sources connected to the supply voltage rail VDD.

Transistor M1, which is connected in a common source configuration (with its source being connected to the voltage supply rail VDD), and the current mirrors 304 and 306 implement the feedback amplifier in the circuit concept of FIG. 2, with transistor M1 providing the majority of the gain. Nevertheless, the current mirrors 304 and/or 306 can also be used to provide gain.

The dominant pole of the preamplifier is determined by the photodiode capacitance Cpd and the effective input impedance, which is set by the transconductance of transistor M1 (gM1), along with a current feedback factor formed by the current mirrors 304 and 306.

For clarity and simplicity, only one output was shown in FIGS. 3A and 3B. However, for completeness, multiple outputs are shown in FIG. 3C, with the additional outputs being implemented by adding one or more additional output transistor and biasing current (e.g., by adding additional transistors M7. Mn and additional biasing currents Iq4 . . . Iqn). The additional transistors can be of a different size than transistor M6, providing for different gain. In such cases, the bias currents provided for the additional transistors should be appropriately set.

It is noted that generally most of the indicated transistors would be cascoded to improve output impedance and overall operation. However, this cascading has been omitted here for clarity. Accordingly, embodiments of the present invention also cover embodiments where the transistors are cascoded.

Reduction of the input noise level is of the primary concern for good signal-to-noise ratio (SNR). The current-mode preamplifiers of the present invention substantially remove the thermal noise floor restriction imposed by a feedback resistor.

In accordance with an embodiment of the present invention, some form of added frequency compensation circuit can be added for stability. For example, this can be accomplished by including a resistor-capacitor series pair connected between the gate and the drain of transistor M1, as shown in FIG. 3C.

Embodiments of the present invention are advantageous because they combine features normally associated with a photo-detector preamplifier whilst providing a much wider dynamic range. Further, embodiments of the present invention provide a simple means of gain adjustment to reduce dynamic range requirements on subsequent stages. Additionally, embodiments of the present invention permit a large bias voltage (VDD–Vgs) to be applied across the photo-detector, thereby providing for fast photo-diode performance.

While in the above discussed FIGS. transistors M1, M4, M5 and M6 are shown as PMOS transistors, and transistors M2 and M3 are shown as NMOS transistors, one of ordinary skill in the art would understand that transistors M1, M4, M5 and M6 can be replaced with pnp bipolar junction (BJT) transistors, and transistors M2 and M3 can be replaced with npn BJT transistors. Other types of transistors can also be used.

One of ordinary skill in the art would appreciate that the circuits could essentially be flipped by replacing NMOS transistors with PMOS transistors, and PMOS transistors with NMOS transistors, and appropriately adjusting the voltage supply rails. The same holds true for replacing npn BJT transistors with pnp BJT transistor, and replacing pnp BJT transistors with npn BJT transistors.

Current-mode preamplifiers of the present invention are intended to overcome the disadvantages of the conventional TIA approach. In particular, current-mode preamplifiers of the present invention have many advantages over the conventional TIA approach. For example, current-mode preamplifiers of the present invention provide for process-independency of gain setting due to the use of current mirrors as gain elements. Additionally, voltage headroom is significantly improved due to the fact that all the node impedances can be made relatively low compared to the impedance of a feedback resistor. This significantly improves the large signal transient behavior of the preamplifier and enables a much wider dynamic working range. Embodiments of the present invention can also provide for constant bandwidth regardless of gain setting. Additionally, embodiments of the present invention result in little gain peaking in the frequency domain due to the flat input impedance characteristic. Further, with embodiments of the present invention there is no need for compensation network adjustments for different gain settings. This greatly simplifies the design and layout of preamplifiers that require multiple gain settings. Furthermore, current-mode preamplifiers of the present invention are particularly superior to the voltage-mode TIA approach when the input capacitance is relatively large.

The improved wide dynamic range obtained by current-mode preamplifiers of the present invention is particularly useful for optical data storage applications, e.g., during writing to and/or reading from a disk surface. Embodiments of the present invention are also particularly useful for optical data transmission applications. Embodiments of the present invention are also useful for other applications where it is desirable to provide process independent gain settings, to allow gain adjustments without requiring compensation network adjustments and/or to provide constant bandwidth regardless of gain setting. Accordingly, embodiments of the present invention should not be limited to use with optical data storage applications and optical data transmission applications.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A current-mode preamplifier including an input and an output, the preamplifier comprising:
   a first transistor including a gate connected to the input of the preamplifier, a source connected to a first voltage supply rail, and a drain;
   a first current mirror including an input connected to the drain of the first transistor, and an output, the first current mirror connected to a second voltage supply rail; and
   a second current mirror including an input connected to the output of the first current mirror, a first output connected to the input of the preamplifier, and a second output connected to the output of the preamplifier, the second current mirror connected to the first voltage supply rail.

2. The preamplifier of claim 1, further comprising one or more of the following:
   a first biasing current source connected between the input of the preamplifier and the second voltage supply rail;
   a second biasing current source connected between the input of the first current mirror and the second voltage supply rail; and
   a third biasing current source connected between the output of the preamplifier and the second voltage supply rail.

3. The preamplifier of claim 1, wherein the first current mirror includes:
   a second transistor including a gate and a drain connected together and forming the input of the first current mirror, and a source connected to the second voltage supply rail; and
   a third transistor including a gate connected to the gate of the second transistor, a source connected to the second voltage supply rail, and a drain forming the output of the first current mirror.

4. The preamplifier of claim 3, wherein the second current mirror includes:
   a fourth transistor including a gate and a drain connected together and forming the input of the second current mirror, and a source connected to the first voltage supply rail;
   a fifth transistor including a gate connected to the gate of the fourth transistor, a source connected to the first voltage supply rail, and a drain forming the first output of the second current mirror; and
   a sixth transistor including a source connected to the first voltage supply rail, a gate connected to the gates of the fourth and fifth transistors, and a drain forming the second output of the second current mirror.

5. The preamplifier of claim 4, wherein the second current mirror includes:
   a further transistor including a source connected to the first voltage supply rail, a gate connected to the gates of the fourth, fifth and sixth transistors, and a drain forming a third output of the second current mirror, the third output of the second current mirror connected to a further output of the preamplifier.

6. The preamplifier of claim 5, further comprising a further biasing current source connected between the further output of the preamplifier and the second voltage supply rail.

7. The current output stage of claim 4, wherein:
   the first voltage source comprises VDD;
   the second voltage source comprises VSS;
   each of the first, fourth, fifth and sixth transistors comprises a PMOS transistor; and
   each of the second and third transistors comprises an NMOS transistor.

8. The current output stage of claim 4, wherein:
   the first voltage source comprises VSS;
   the second voltage source comprises VDD;
   each of the first, fourth, fifth and sixth transistors comprises an NMOS transistor; and
   each of the second and third transistors comprises a PMOS transistor.

9. The preamplifier of claim 1, wherein:
   the first current mirror includes:
      a second transistor including a gate and a drain connected together and forming the input of the first current mirror, and a source connected to the second voltage supply rail; and
      a third transistor including a gate connected to the gate of the second transistor, a source connected to the second voltage supply rail, and a drain forming the output of the first current mirror; and the second current mirror includes:
a fourth transistor including a gate and a drain connected together and forming the input of the second current mirror, and a source connected to the first voltage supply rail;
a fifth transistor including a gate connected to the gate of the fourth transistor, a source connected to the first voltage supply rail, and a drain forming the first output of the second current mirror; and
a sixth transistor including a source connected to the first voltage supply rail, a gate connected to the gates of the fourth and fifth transistors, and a drain forming the second output of the second current mirror.

10. The preamplifier of claim 9, further comprising one or more of the following:
a first biasing current source connected between the drain of the fifth transistor and the second voltage supply rail;
a second biasing current source connected between the drain of the first transistor and the second voltage supply rail; and
a third biasing current source connected between the drain of the sixth transistor and the second voltage supply rail.

11. The current output stage of claim 9, wherein:
the first voltage source comprises VDD;
the second voltage source comprises VSS;
each of the first, fourth, fifth and sixth transistors comprises a PMOS transistor; and
each of the second and third transistors comprises an NMOS transistor.

12. The current output stage of claim 9, wherein:
the first voltage source comprises VSS;
the second voltage source comprises VDD;
each of the first, fourth, fifth and sixth transistors comprises an NMOS transistor; and
each of the second and third transistors comprises a PMOS transistor.

13. The preamplifier of claim 1, further comprising a resistor and a capacitor connected in series between the gate and the drain of the first transistor to provide frequency compensation.

14. A current-mode preamplifier including an input and an output, the preamplifier comprising:
a transistor including a control terminal connected to the input of the preamplifier, and a current path including a first terminal and a second terminal, the first terminal of the current path connected to a first voltage supply rail;
a first current mirror including an input connected to the second terminal of the current path of the transistor, and an output, the first current mirror connected to a second voltage supply rail; and
a second current mirror including an input connected to the output of the first current mirror, a first output connected to the input of the preamplifier, and a second output connected to the output of the preamplifier, the second current mirror connected to the first voltage supply rail.

15. The preamplifier of claim 14, wherein the transistor comprises a MOSFET transistor.

16. The current output stage of claim 15, wherein the control terminal comprises a gate terminal, and the current path comprises a source-drain path.

17. The current output stage of claim 16, wherein the transistor comprises a PMOS transistor.

18. The current output stage of claim 16, wherein the transistor comprises an NMOS transistor.

19. The current output stage of claim 14, wherein the transistor comprises a BJT transistor.

20. The current output stage of claim 19, wherein the control terminal comprises a base terminal, and the current path comprises an emitter-collector path.

21. The preamplifier of claim 20, wherein the transistor comprises a pnp transistor.

22. The preamplifier of claim 20, wherein the transistor comprises an npn transistor.

23. The preamplifer of claim 14, further comprising at least one of the following:
a first biasing current source connected between the first output of the second current mirror and the second voltage supply rail;
a second biasing current source connected between the second terminal of the current path and the second voltage supply rail; and
a third biasing current source connected between the second output of the second current mirror and the second voltage supply rail.

24. A current-mode preamplifier including an input and an output, the preamplifier comprising:
a first transistor including a gate connected to the input of the preamplifier, a source connected to a first voltage supply rail, and a drain;
a second transistor including a gate and a drain connected together and to the drain of the first transistor, and a source connected to a second voltage supply rail;
a third transistor including a gate connected to the gate of the second transistor, a source connected to the second voltage supply rail, and a drain;
a fourth transistor including a gate a drain connected together and connected to the drain of the third transistor, and a source connected to the first voltage supply rail;
a fifth transistor including a gate connected to the gate of the fourth transistor, a source connected to the first voltage supply rail, and a drain connected to the input of the preamplifer; and
a sixth transistor including a source connected to the first voltage supply rail, a gate connected to the gates of the fourth and fifth transistors, and a drain connected to the output of the preamplifer.

25. The preamplifier of claim 24, further comprising a resistor and a capacitor connected in series between the gate and the drain of the first transistor to provide frequency compensation.

26. The preamplifier of claim 24, further comprising:
a biasing current source connected between the drain of the first transistor and the second voltage supply rail.

27. The preamplifier of claim 24, further comprising:
a biasing current source connected between the drain of the fifth transistor and the second voltage supply rail; and
a further biasing current source connected between the drain of the sixth transistor and the second voltage supply rail.

28. The preamplifier of claim 24, further comprising:
a further transistor including a source connected to the first voltage supply rail, a gate connected to the gates of the fourth, fifth and sixth transistors, and a drain connected to a further output of the preamplifer.

29. The preamplifier of claim 24, further comprising a resistor and a capacitor connected in series between the gate and the drain of the first transistor to provide frequency compensation.

* * * * *